US012805103B2

(12) United States Patent
Xu

(10) Patent No.: US 12,805,103 B2
(45) Date of Patent: Nov. 17, 2026

(54) ARRAY SUBSTRATE AND MANUFACTURING METHOD THEREOF, AND DISPLAY PANEL

(71) Applicant: Shenzhen China Star Optoelectronics Semiconductor Display Technology Co., Ltd., Shenzhen (CN)

(72) Inventor: Qiankun Xu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 342 days.

(21) Appl. No.: 18/369,860

(22) Filed: Sep. 19, 2023

(65) Prior Publication Data

US 2024/0222396 A1 Jul. 4, 2024

(30) Foreign Application Priority Data

Dec. 30, 2022 (CN) ......................... 202211737090.3

(51) Int. Cl.

| | |
|---|---|
| ***H10K 10/46*** | (2023.01) |
| ***H10K 19/10*** | (2026.01) |
| ***H10K 71/13*** | (2023.01) |

(52) U.S. Cl.

CPC ......... *H10K 10/466* (2023.02); *H10K 10/484* (2023.02); *H10K 19/10* (2023.02); *H10K 71/135* (2023.02)

(58) Field of Classification Search

CPC ........................... H10K 10/466; H10K 71/135

See application file for complete search history.

(56) References Cited

U.S. PATENT DOCUMENTS

2002/0012080 A1 * 1/2002 Ishihara ............. H10D 30/6757 257/E21.252
2010/0033407 A1 * 2/2010 Harada ................ H10K 59/125 345/76
2010/0090204 A1 * 4/2010 Chuman .............. H10K 10/466 257/E51.001
2010/0123125 A1 5/2010 Lee et al.

FOREIGN PATENT DOCUMENTS

CN 101740720 6/2010
CN 106229298 12/2016

OTHER PUBLICATIONS

Notification of Office Action and Search Report Dated Jul. 24, 2026 From The State Intellectual Property Office of the People's Republic of China Re. Application No. 202211737090.3 and Its Translation Into English. (14 Pages).

* cited by examiner

*Primary Examiner* — Daniel Luke

(57) ABSTRACT

Embodiments of the present application provide an array substrate and a manufacturing method thereof, and a display panel. The array substrate includes a substrate, a source electrode, a drain electrode, a semiconductor layer, and a channel defining layer. The semiconductor layer is disposed between the source electrode and the drain electrode, and the semiconductor layer partially overlaps with the source electrode and the drain electrode. The channel defining layer is disposed around the semiconductor layer, and is correspondingly disposed on the source electrode and the drain electrode. When the semiconductor layer is prepared, the semiconductor layer is directly printed in a printing opening defined in the channel defining layer. Overflow of the semiconductor layer is prevented by the channel defining layer.

18 Claims, 4 Drawing Sheets

ARRAY SUBSTRATE AND MANUFACTURING METHOD THEREOF, AND DISPLAY PANEL

RELATED APPLICATION

This application claims the benefit of priority of China Patent Application No. 202211737090.3 filed on Dec. 30, 2022, the contents of which are incorporated by reference as if fully set forth herein in their entirety.

TECHNICAL FIELD

The present application relates to the technical field of design and manufacturing of display panels, and especially relates to an array substrate and a manufacturing method thereof, and a display panel.

BACKGROUND

With continuous development of manufacturing technologies of display panels, people put forward higher requirements for various performances of the display panels and devices.

In prior arts, when a display panel is being prepared, it is necessary to prepare an array substrate which is corresponding to the display panel and includes a plurality of thin film transistors in the array substrate, so as to ensure a normal use of the display panel. Structures of the thin film transistors which are commonly used generally include functional film layers such as a source electrode, a drain electrode, a gate, and a semiconductor layer. When the functional film layers is being prepared, for example, when the semiconductor layer is being prepared, semiconductor materials which are commonly used are inorganic semiconductor materials. The inorganic semiconductor materials also require different etching processes for processing. Meanwhile, in manufacturing processes, Many times of deposition of different film layers and photomask processing are required to finally form desired structures. However, there are too many process steps, and there are certain deviations in many different processing steps, which reduce consistency of films. Thus, production costs are increased, and it is not conducive to further improve comprehensive performance of thin film transistor array substrates.

In summary, for the thin film transistors prepared in the prior arts, the manufacturing processes of the thin film transistors are complicated, which requires many times of the deposition of film layers and etching processing. Production costs are much high, and it is not conducive to improve comprehensive performance of the array substrate.

SUMMARY

An object of the present application is to provide an array substrate and a manufacturing method thereof, and a display panel, so as to effectively improve problems that manufacturing processes of thin film transistors in existing display panel are complex and comprehensive performance of the thin film transistors are not ideal.

In order to solve technical problems mentioned above, the present application provides an array substrate, the array substrate includes:

a substrate;

a source electrode and a drain electrode disposed on the substrate, the drain electrode is disposed at one side of the source electrode;

a semiconductor layer disposed between the source electrode and the drain electrode, and the semiconductor layer overlaps with a portion of the source electrode and a portion of the drain electrode; and a channel defining layer, the channel defining layer is correspondingly disposed on the source electrode and the drain electrode, and is disposed around the semiconductor layer.

According to an embodiment of the present application, the film thickness of the channel defining layer is greater than or equal to the film thickness of the semiconductor layer.

According to an embodiment of the present application, the channel defining layer is provided with a printing opening, and the semiconductor layer is correspondingly disposed in the printing opening, and is in contact with the channel defining layer, the source electrode, and the drain electrode which are corresponding to the printing opening.

According to an embodiment of the present application, the source electrode and the drain electrode are correspondingly disposed at two sides of the printing opening, and a portion of the source electrode and a portion of the drain electrode extend into the printing opening.

According to an embodiment of the present application, each of the source electrode and the drain electrode comprises an extension portion, the extension portion of the source electrode and the extension portion of the drain electrode both extend into the printing opening, and at least a portion of the semiconductor layer overlaps with the extension portion of the source electrode and the extension portion of the drain electrode.

According to an embodiment of the present application, the length of the extension portion of the source electrode is the same as the length of the extension portion of the drain electrode, and an overlapping area between the semiconductor layer and the extension portion of the source electrode is the same as overlapping area between the semiconductor layer and the extension portion of the drain electrode.

According to an embodiment of the present application, the length of the extension portion of the source electrode and the length of the extension portion of the drain electrode are greater than or equal to 2.5 millimetre.

According to an embodiment of the present application, the width of the source electrode and the width of the drain electrode are less than the width of the semiconductor layer.

According to a second aspect of embodiments of the present application, a display panel is provided, and the display panel includes the array substrate in embodiments of the present application.

According to a third aspect of embodiments of the present application, a manufacturing method of an array substrate is provided, the manufacturing method of the array substrate includes following steps:

preparing a substrate, and depositing a gate on the substrate;

depositing a gate insulating layer on the gate, and preparing a source/drain metal layer on the gate insulating layer;

preparing a channel defining layer on the source/drain metal layer, etching the source/drain metal layer and the channel defining layer to form a printing opening;

printing a semiconductor layer in the printing opening, and drying the semiconductor layer; and preparing a passivation layer on the semiconductor layer.

In terms of beneficial effects of embodiments of the present application, compared with prior arts, embodiments of the present application provide the array substrate and the manufacturing method thereof, and the display panel. The array substrate includes the substrate, the source electrode, the drain electrode, the semiconductor layer and the channel defining layer. The semiconductor layer is disposed between the source electrode and the drain electrode, and partially overlaps with the source electrode and the drain electrode. The channel defining layer is disposed around the semiconductor layer and is correspondingly disposed on the source electrode and the drain electrode. When the semiconductor layer is being prepared, the semiconductor layer is directly printed in the printing opening defined in the channel defining layer. The channel defining layer prevents the semiconductor layer from overflowing, and the semiconductor layer is further dried, so that the array substrate is finally formed. In the embodiments of the present application, the semiconductor layer is directly prepared by printing, thereby effectively simplifying preparation processes of film layers in the array substrate and improving comprehensive performance of the display panel.

BRIEF DESCRIPTION OF THE DRAWINGS

In order to more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which those skilled in the art can derive further figures without making any inventive efforts.

DETAILED DESCRIPTION OF THE EMBODIMENT

Figure 1:
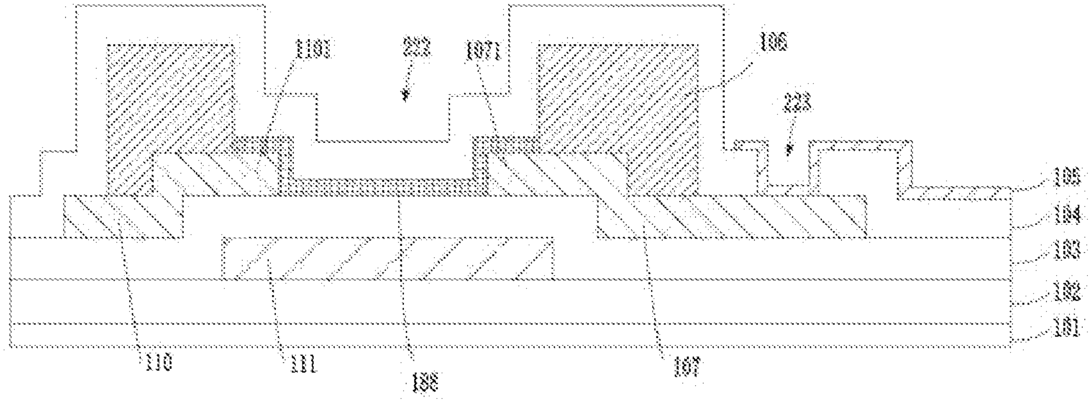
FIG. 1 is a schematic diagram of film layer structures of an array substrate provided by embodiments of the present application.

Technical solutions of the present application are described below in conjunction with drawings in embodiments of the present application. The following disclosure provides different embodiments or examples to realize different structures of the present application. To simplify the present application, components and arrangements of specific examples are described below. In addition, various examples of specific processes and materials provided by the present application make it that those skilled in the art can realize applications of other technologies. All other embodiments obtained by those skilled in the art without creative efforts fall within the protection scope of the present application.

In description of the present application, It should be understood that orientations or position relationships indicated by terms such as “center”, “longitudinal”, “transverse”, “length”, “width”, “thickness”, “up”, “down”, “front”, “back”, “left”, “right”, “vertical”, “horizontal”, “top”, “bottom”, “inside”, “outside”, “clockwise”, “counter-clockwise”, etc. are based on orientations or position relationships shown in the drawings, which are only for convenience of describing the present application and simplifying the description, and does not indicate or imply that a device or an element referred to must have a specific orientation, be constructed and operated in a specific orientation. Therefore, it should not be interpreted as a limitation of the present application. In addition, terms such “first” and “second” are only used for description, and cannot be interpreted as indicating or implying relative importance or implying a number of technical features indicated.

With continuous development of manufacturing technologies of display panels and array substrates, people put forward higher requirements for performance and display effect of the display panels.

In a process of manufacturing the array substrate, a plurality of thin film transistors are usually formed in the array substrate. Active layers and other functional layers in the thin film transistors play important roles in terms of performance of the thin film transistors. In existing preparation processes, when the active layers of the thin film transistor are being prepared, deposition or evaporation are usually carried out to form the active layers. Then, many times of photomask processing are performed to prepare the active layers after deposition or evaporation. Therefore, processing procedures are more complicated, and production costs are high, and it is not conducive to further improve comprehensive performance of the display panels.

In embodiments of the present application, an array substrate and a display panel or a display device that is corresponding to the array substrate are provided. When an active layer in the array substrate is being prepared, the active layer is prepared by directly printing an organic semiconductor layer. Thus, preparation processes are effectively simplified, production costs are reduced, and comprehensive performance of the display panel are effectively improved.

As shown in FIG. 1, FIG. 1 is a schematic diagram of film layer structures of an array substrate provided by embodiments of the present application. The array substrate includes a substrate 101, a buffer layer 102, a gate insulating layer 103, a passivation layer 104, and functional film layers.

In embodiments of the present application, the functional film layers include a gate 111, a source electrode 110, a drain electrode 107, a semiconductor layer 188, and a channel defining layer 106. Specifically, the buffer layer 102 is disposed on the substrate 101. The substrate 101 may be provided with a flexible or rigid film layer, and film layers are supported by the substrate 101. In embodiments of the present application, the substrate 101 may be provided with a glass substrate. Meanwhile, the buffer layer 102 may be provided with a flexible or rigid film layer. Film materials of the substrate 101 and the buffer layer 102 can be selected according to different products.

Specifically, the gate 111 is disposed on the buffer layer 102, and the gate insulating layer 103 is disposed on the buffer layer 102. Meanwhile, the gate insulating layer 103 completely covers and protects the gate 111.

In embodiments of the present application, a source/drain metal layer is disposed on the gate insulating layer 103. The source/drain metal layer includes the source electrode 110 and the drain electrode 107. The source electrode 110 and the drain electrode 107 are both disposed on the gate insulating layer 103. For example, the source electrode 110 and the drain electrode 107 are disposed on two corresponding positions of the gate insulating layer 103, respectively.

Meanwhile, the semiconductor layer 188 is disposed on the gate insulating layer 103, and the semiconductor layer

188 is electrically connected to the source electrode 110 and the drain electrode 107 at the same time. For example, one end of the semiconductor layer 188 is electrically connected to the source electrode 110, another end of the semiconductor layer 188 is electrically connected to the drain electrode 107. In embodiments of the present application, the semiconductor layer 188 is prepared directly by printing an organic semiconductor material with ink, thereby effectively simplifying preparation processes of the semiconductor layer and reducing production costs.

In embodiments of the present application, in the array substrate, a channel defining layer 106 is further included, the channel defining layer 106 is disposed on the source/drain metal layer. Specifically, the channel defining layer 106 is disposed on the source electrode 110 and the drain electrode 107, and the channel defining layer 106 is disposed around the semiconductor layer 188.

Specifically, the channel defining layer 106 further includes a printing opening 222. The semiconductor layer 188 is correspondingly disposed in the printing opening 222. At the time of preparation, the organic semiconductor material is printed directly in the printing opening 222, and finally a desired film structure is obtained.

In embodiments of the present application, when the semiconductor layer 188 is provided, the thickness of the semiconductor layer 188 may be set to a same thickness at different regions. Or, according to actual requirements, the thickness of the semiconductor layer 188 adjacent to the source electrode 110 and the drain electrode 107 is greater than the thickness of the semiconductor layer 188 in the middle of the printing opening 222. There is no specific limitation here.

Figure 2:
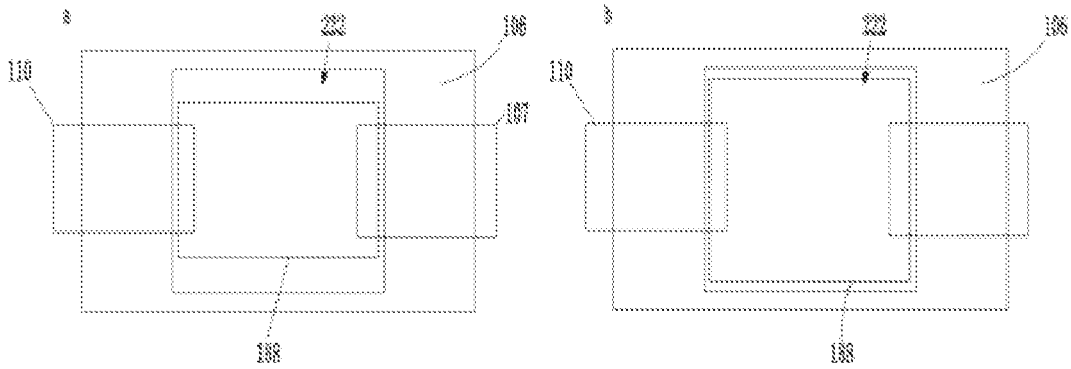
FIG. 2 is a schematic diagram of planar wirings corresponding to some film layers of a thin film transistor provided by embodiments of the present application.

As shown in FIG. 2, FIG. 2 is a schematic diagram of planar wirings corresponding to some film layers of a thin film transistor provided in an embodiment of the present application. In conjunction with the film layer structures in FIG. 1, the semiconductor layer 188 in embodiments of the present application is disposed in the printing opening 222, and may fill a portion of the printing opening 222.

Herein, the figure identified by "a" and the figure identified by "b" in FIG. 2 represent two different structures. An area of the semiconductor layer 188 in the figure "a" is less than an area of the semiconductor layer 188 in the figure "b". Or, an area of the printing opening 222 is adjusted, different film layer structures are arranged according to different products, so that best performance of the thin film transistor can be achieved, and comprehensive performance of the display panel can be effectively improved.

In the embodiments of the present application, as the printing opening 222 can be adjusted according to different product specifications, when a printing is carried out to form a layer, the thickness of the semiconductor layer can be adjusted by increasing or decreasing a volume of ink including an organic semiconductor material according to the requirements of different products. As a result, a purpose of saving materials is achieved. Meanwhile, as the area of the printing opening 222 can be adjusted, devices with different aperture ratios can also be prepared in the present application.

Meanwhile, in embodiments of the present application, the width of the source electrode 110 and the width of the drain electrode 107 may be less than the width of the semiconductor layer 188. In this way, better connection effect and better connection reliability between the source electrode 110, the drain electrode 107 and the semiconductor layer 188 are ensured.

Further, in conjunction with the film layer structures in FIG. 1, in embodiments of the present application, the film thickness of the semiconductor layer 188 is less than the film thickness of the channel defining layer 106. Thus, the semiconductor layer 188 is defined by the channel defining layer 106. An Organic semiconductor ink which is printed is effectively prevented from overflowing from the channel defining layer 106 during the preparation processes to ensure performance of the semiconductor layer 188.

Meanwhile, in the printing opening 222, the semiconductor layer 188 overlaps with the source electrode 110 and drain electrode 107, and is in contact with an inner sidewall of the channel defining layer 106.

In embodiments of the present application, when a source/drain metal layer structure is provided, the source electrode 110 and the drain electrode 107 are correspondingly disposed at two sides of the printing opening 222, and a portion of the source electrode 110 and a portion of the drain electrode 107 extend into the printing opening 222.

Specifically, the source electrode 110 includes a first extension portion 1101, and the drain electrode 107 includes a second extension portion 1071. The first extension portion 1101 and the second extension portion 1071 are both disposed in the printing opening 222.

Meanwhile, both ends of the semiconductor layer 188 are connected to the first extension portion 1101 and the second extension portion 1071, respectively. For example, a portion of the semiconductor layer 188 is disposed on the first extension portion 1101, and a portion of the semiconductor layer 188 is disposed on and overlaps with the second extension portion 1071.

In embodiments of the present application, the extension length of the first extension portion 1101 may be the same as the extension length of the second extension portion 1071. Optionally, an overlapping area between the semiconductor layer 188 and the first extension portion 1101 may be the same as an overlapping area between the semiconductor layer 188 and the second extension portion 1071. Thus, same contact areas between different films are ensured, and stability and consistency of performance of the thin film transistor are ensured.

Specifically, the extension length of the first extension portion 1101 and the extension length of the second extension portion 1071 may be set to be greater than or equal to 2.5 millimeters. Meanwhile, the thickness of the semiconductor layer 188 may be set to be greater than 100 nanometers. For example, the thickness of the semiconductor layer 188 may be set to be 100 nanometers, 150 nanometers or the like. Optionally, the length of the first extension portion 1101 and the length of the second extension portion 1071 are set to be 2.5 millimeters, 3 millimeters, 5 millimeters or 7 millimeters. Or, the length of the first extension portion 1101 and the length of the second extension portion 1071 are set according to different product specifications. Thus, connecting effect between different films is ensured, and reliability of the devices is ensured.

In embodiments of the present application, when the array substrate is being prepared, the passivation layer 104 is disposed on the gate insulating layer 103, and the passivation layer 104 completely covers the channel defining layer 106 and the semiconductor layer 188. Meanwhile, the passivation layer 104 also covers portions of the source electrode 110 and the drain electrode 107. Thus, each of the film layers is encapsulated and protected.

Further, in embodiments of the present application, the array substrate is further provided with a via hole 223 disposed outside the channel defining layer 106. Meanwhile, the via hole 223 goes through the passivation layer 104 and exposes a portion of the drain electrode 107. In the embodiments of the present application, the via hole 223 is correspondingly disposed at a position above the drain electrode 107.

Further, the array substrate in the embodiments of the present application further includes a pixel electrode layer 105, and the pixel electrode layer 105 is disposed above the passivation layer 104. The pixel electrode layer 105 is disposed at one side of the drain electrode 107. Meanwhile, the pixel electrode layer 105 is electrically connected to the drain electrode 107 through the via hole 223. When the thin film transistor operates normally, a control signal is transmitted through the thin film transistor and the pixel electrode layer 105 to ensure a normal operation of the display panel.

Figure 3:
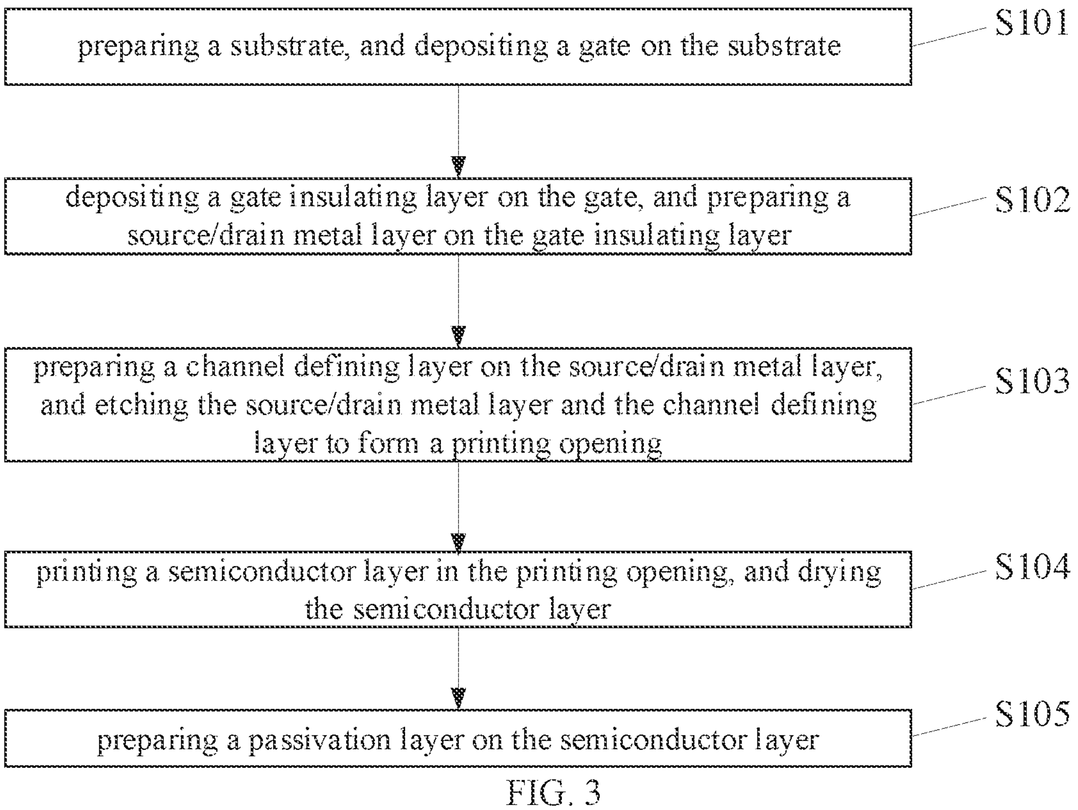
FIG. 3 is a flow chart of preparation process of an array substrate provided by embodiments of the present application.

In embodiments of the present application, a manufacturing method of an array substrate is provided. As shown in FIG. 3, FIG. 3 is a flow chart of preparation process of the array substrate provided by embodiments of the present application. The manufacturing method includes following steps:

- S101: preparing a substrate, and depositing a gate on the substrate;
- S102: depositing a gate insulating layer on the gate, and preparing a source/drain metal layer on the gate insulating layer;
- S103: preparing a channel defining layer on the source/drain metal layer, etching the source/drain metal layer and the channel defining layer to form a printing opening;
- S104: printing a semiconductor layer in the printing opening, and drying the semiconductor layer; and
- S105: preparing a passivation layer on the semiconductor layer.

Specifically, in conjunction with FIG. 4 to FIG. 11, FIG. 4 to FIG. 11 are schematic diagrams of film layer structures in different processes provided by embodiments of the present application.

Figure 4:
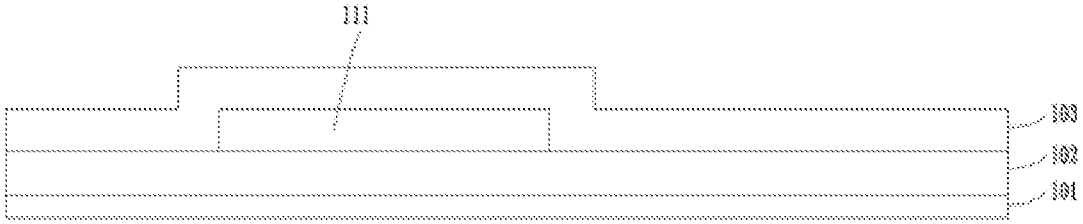
FIG. 4 to FIG. 11 are schematic diagrams of film layer structures in different processes provided by embodiments of the present application.

Referring to a structure in FIG. 4 for details, a substrate 101 is provided, and a buffer layer 102 is deposited on the substrate 101. In embodiments of the present application, the substrate 101 may be directly provided with a glass substrate. After the substrate 101 and the buffer layer 102 are prepared and dried to form films, a gate 111 is disposed on the buffer layer 102. Then, a gate insulating layer 103 is disposed on the buffer layer 102, and the gate insulating layer 103 completely covers the gate 111, so that the gate 111 is insulated from other film layers.

Figure 5:
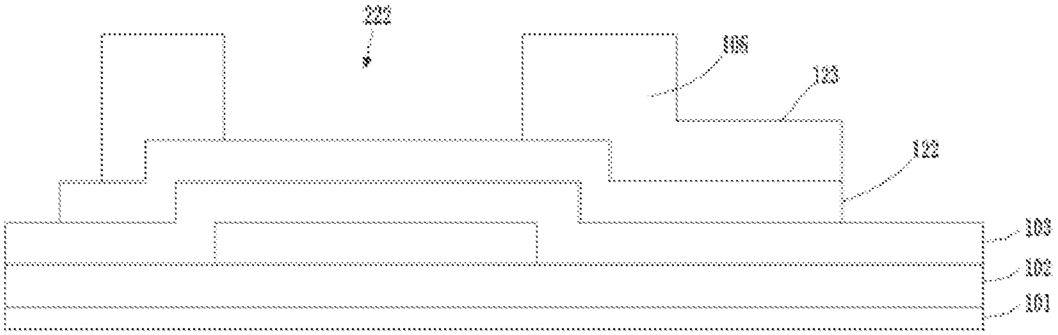

Referring to film layers structures in FIG. 5, after the gate insulating layer 103 is deposited and dried to form a film, a source/drain metal layer 122 is deposited on the gate insulating layer 103. The source/drain metal layer 122 is entirely deposited on the gate insulating layer 103.

After the source/drain metal layer 122 is deposited and dried, then a channel defining layer 106 is deposited on the source/drain metal layer 122, and the channel defining layer 106 is cured into a film. In embodiments of the present application, the channel defining layer 106 may be provided with an inorganic film layer, such as SiNx or the like. Or, the channel defining layer 106 may include organic materials according to requirements of different products, which is not repeated here.

After preparation of the channel defining layer 106 is completed, an etching process is performed using a half-mask process. Specifically, the channel defining layer 106 is subjected to a half-mask etching process. After the half-mask etching process is completed, the channel defining layer 106 includes a step 123, and at a position corresponding to the gate 111, the channel defining layer 106 is further provided with a printing opening 222 by etching, the printing opening 222 exposes a surface of the source/drain metal layer 122.

Figure 6:
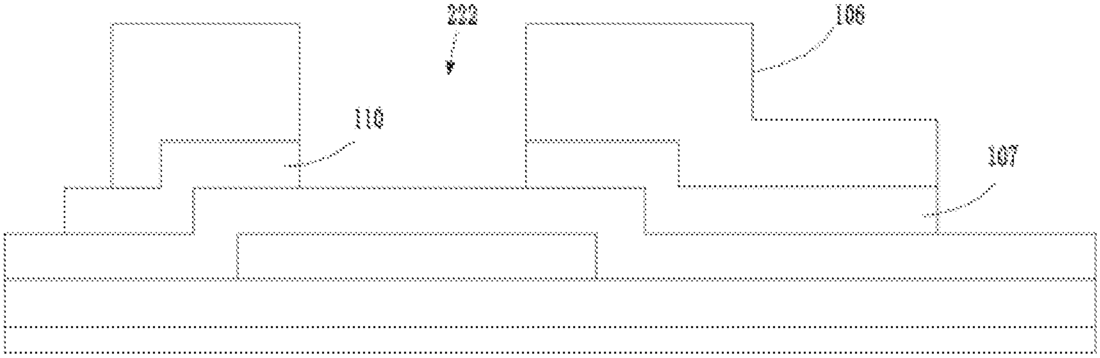

Referring to FIG. 6 for details, the channel defining layer 106 and the source/drain metal layer 122 are further etched. Specifically, the source/drain metal layer 122 corresponding to the printing opening 222 is etched, and the surface of the gate insulating layer 103 is exposed. Thus, the source/drain metal layer 122 includes the source electrode 110 and the drain electrode 107.

Figure 7:
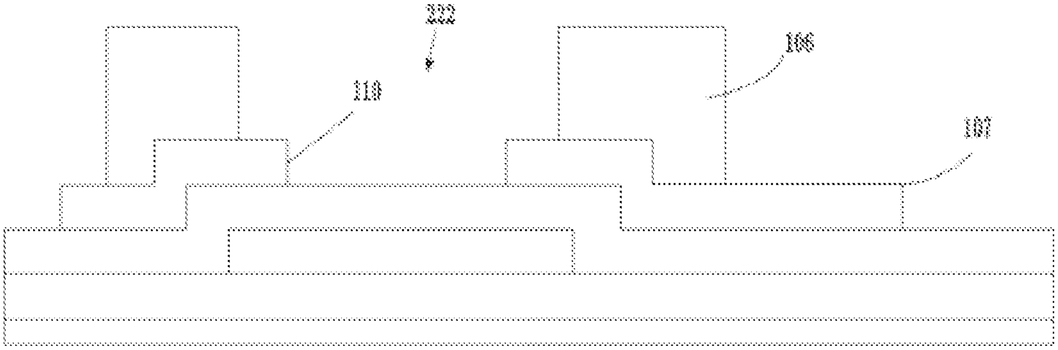

Further, Referring to FIG. 7 for details, an etching of the channel defining layer 106 is continued. At this time, an etching process of the channel defining layer 106 may be performed using a dry etching process. Specifically, a portion of the channel defining layer 106 adjacent to the printing opening 222 is etched so that a portion of the source electrode 110 and a portion of the drain electrode 107 are exposed within the printing opening 222. At this time, an opening aperture of the printing opening 222 becomes larger.

Meanwhile, when the portion of the channel defining layer 106 adjacent to the printing opening 222 is being etched, the channel defining layer 106 on the drain electrode 107 is also etched. At this step, the step 123 is mainly etched so that a portion of the drain electrode 107 is exposed.

Figure 8:
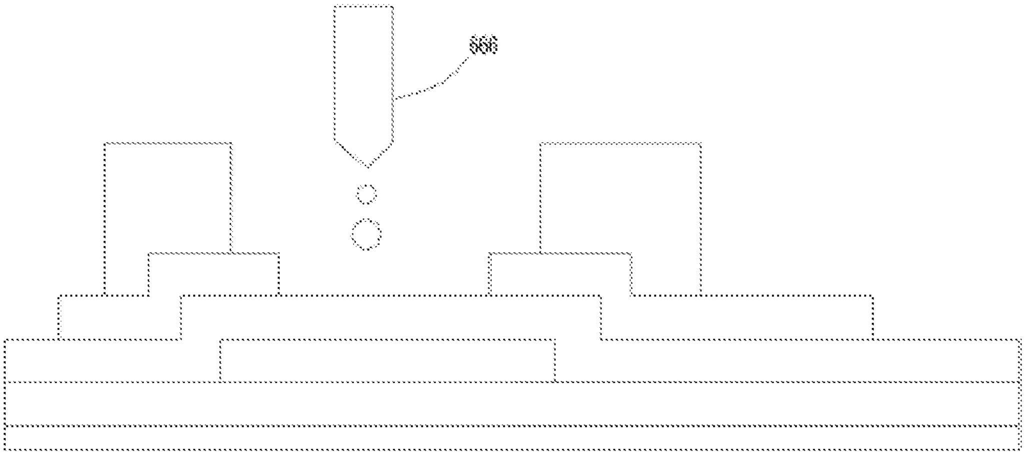

Referring to FIG. 8 for details, after the etchings of the channel defining layer 106 and the source electrode 110 and the drain electrode 107 are completed, a semiconductor layer is prepared by printing. Specifically, in embodiments of the present application, the semiconductor layer is mainly an organic semiconductor layer. A material of organic semiconductor ink is added to a corresponding printing device 666, and then an ink-jet printing is performed by the printing device 666. By this way, the organic semiconductor layer is formed.

Figure 9:
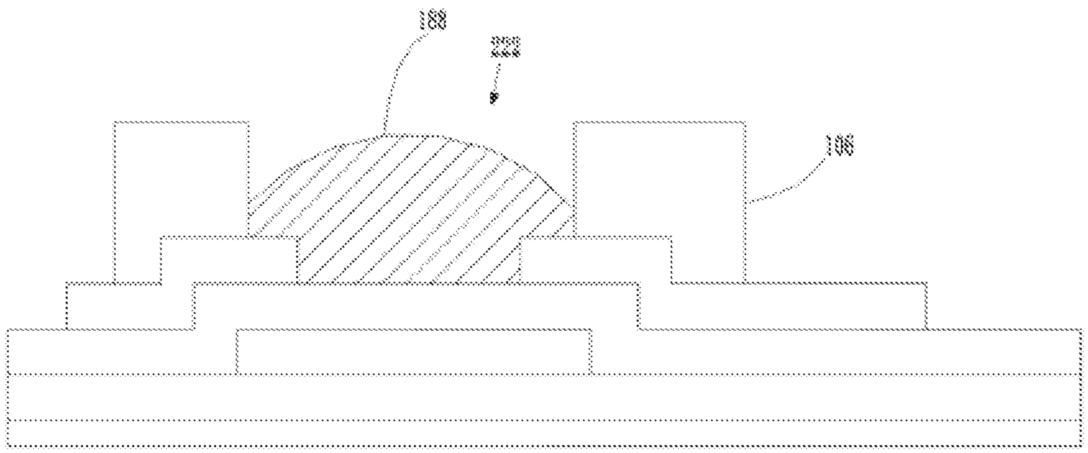

Further, referring to FIG. 9 for details, after the printing of the organic semiconductor ink is completed, the organic semiconductor ink with a certain thickness is accumulated in the printing opening 222. In the embodiments of the present application, as the channel defining layer 106 is disposed around the printing opening 222, the organic semiconductor ink can be blocked in the printing opening 222 and can not overflow to other places, thereby ensuring the printing effect of the organic semiconductor ink. Meanwhile, in embodiments of the present application, a content and a printing thickness of the organic semiconductor ink can be set according to different products, and the organic semiconductor ink can select different semiconductor materials according to different product requirements, which is not repeatedly described here.

Figure 10:
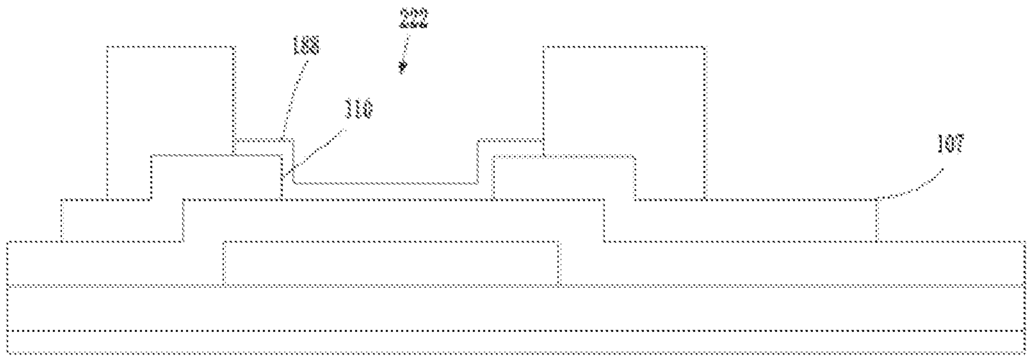

Referring to FIG. 10 for details, the organic semiconductor ink is treated by a drying process, the organic semiconductor ink is cured to form a film, and finally a semiconductor layer 188 is formed. The semiconductor layer 188 is disposed in the printing opening 222, and is electrically connected to both the source electrode 110 and the drain electrode 107. Specifically, the thickness of the semiconductor layer 188 in the embodiments of the present application is set to be 100 nanometers.

Figure 11:
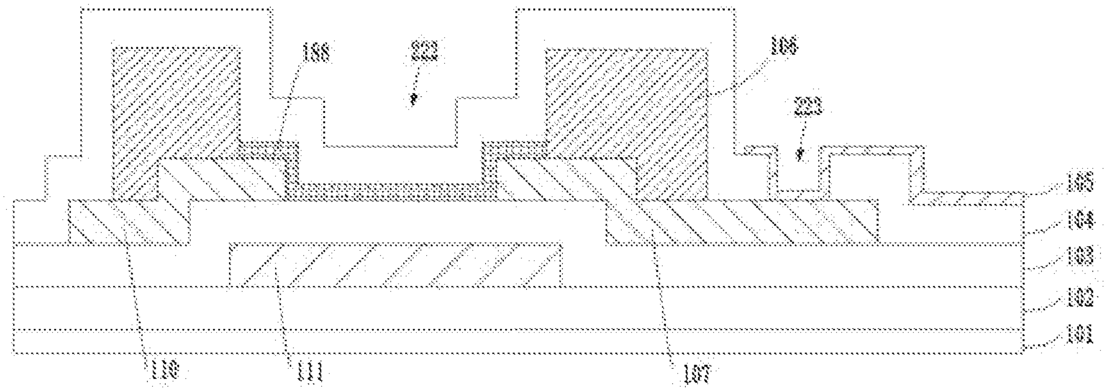

Referring to FIG. 11 for details, after the semiconductor layer 188 is completed, a passivation layer 104 is deposited on the semiconductor layer 188 and the channel defining layer 106. The passivation layer completely covers the semiconductor layer 188 and the channel defining layer 106. Meanwhile, the passivation layer 104 covers a portion of the source electrode 110, a portion of the drain electrode 107, and a portion of the gate insulating layer 103. Therefore, different films are sealed and protected, and a normal operation of the thin film transistor is ensured.

In embodiments of the present application, the thickness of the passivation layer 104 can be set according to different product requirements. After the passivation layer 104 is prepared, a portion of the passivation layer 104 above the drain electrode 107 is etched to form a via hole 223. After an etching of the passivation layer 104 is completed, a surface of the drain electrode 107 is exposed, so that the drain electrode 107 can be electrically connected to other film layers.

Specifically, a pixel electrode layer 105 is deposited on the passivation layer 104. The pixel electrode layer 105 is disposed on a side of the drain electrode 107, and the pixel electrode layer 105 is electrically connected to the drain electrode 107 through the via hole 223, and a control signal is transmitted by the pixel electrode layer 105.

In the embodiments of the present application, the film layer structures and preparation processes of the array substrate are improved. When the semiconductor layer in the array substrate is being prepared, the semiconductor layer is prepared by printing and forming a film. When the printing is being carried out, the channel defining layer is provided, the channel defining layer can effectively prevent a printing ink from overflowing, thus printing effect of the printing ink is ensured. Therefore, the preparation processes of the array substrate are effectively simplified, the production costs of the array substrate are reduced, and the comprehensive performance of the array substrate is effectively improved.

Further, embodiments of the present application further provide a display panel and a display device. Specifically, the display panel includes the array substrate provided in the embodiments of the present application. When the display panel in the embodiments of the present application is being prepared, the semiconductor layer of the array substrate corresponding to the display panel is prepared by printing and forming a film. Preparation processes are simple, and production costs is low, thereby effectively simplifying film layer processes of the display panel, and improving comprehensive performance of the display panel.

In embodiments of the present application, the display panel and the display device may be mobile phones, computers, electronic papers, and display devices, etc., which are products or components that have display functions and driving functions of thin-film transistor, or have functions such as touch control, etc.

In summary, the array substrate and the manufacturing method thereof, and the display panel provided by the embodiment of the present application are described in detail above. This article uses specific cases for describing the principles and the embodiments of the present application, and the description of the embodiments mentioned above is only for helping to understand the method and the core idea of the present application. Although the present application is disclosed above with preferred embodiments, the preferred embodiments are not intended to limit the present application. Those skilled in the art can make various changes and embellishments without departing from the spirit and scope of the present application. Therefore, the scope of the present application is based on the scope defined by the claims.

What is claimed is:

1. An array substrate, comprising:

a substrate;

a source electrode and a drain electrode disposed on the substrate, wherein the drain electrode is disposed at one side of the source electrode;

a semiconductor layer disposed between the source electrode and the drain electrode, wherein the semiconductor layer overlaps with a portion of the source electrode and a portion of the drain electrode; and a channel defining layer, wherein the channel defining layer is correspondingly disposed on the source electrode and the drain electrode, and is disposed around the semiconductor layer;

wherein the semiconductor layer comprises a first segment, a second segment, a third segment, a fourth segment, and a fifth segment connected in sequence; the first segment is perpendicular to the second segment, the first segment is in contact with an upper surface of the portion of the source electrode overlapping with the semiconductor layer, and the second segment is in contact with a side surface of the portion of the source electrode overlapping with the semiconductor layer; the fourth segment is perpendicular to the fifth segment, the fourth segment is in contact with a side surface of the portion of the drain electrode overlapping with the semiconductor layer, and the fifth segment is in contact with an upper surface of the portion of the drain electrode overlapping with the semiconductor layer.

2. The array substrate of claim 1, wherein the film thickness of the channel defining layer is greater than or equal to the film thickness of the semiconductor layer.

3. The array substrate of claim 1, wherein the channel defining layer is provided with a printing opening, the semiconductor layer is correspondingly disposed in the printing opening and is in contact with the source electrode and the drain electrode which are corresponding to the printing opening, and the semiconductor layer is in contact with an inner sidewall of the channel defining layer.

4. The array substrate of claim 3, wherein the source electrode and the drain electrode are correspondingly disposed at two sides of the printing opening, and a portion of the source electrode and a portion of the drain electrode extend into the printing opening.

5. The array substrate of claim 4, wherein each of the source electrode and the drain electrode comprises an extension portion, the extension portion of the source electrode and the extension portion of the drain electrode both extend into the printing opening, and at least a portion of the semiconductor layer overlaps with the extension portion of the source electrode and the extension portion of the drain electrode.

6. The array substrate of claim 5, wherein the length of the extension portion of the source electrode is the same as the length of the extension portion of the drain electrode, and an overlapping area between the semiconductor layer and the extension portion of the source electrode is the same as an overlapping area between the semiconductor layer and the extension portion of the drain electrode.

7. The array substrate of claim 5, wherein the length of the extension portion of the source electrode and the length of the extension portion of the drain electrode are greater than or equal to 2.5 millimeters.

8. The array substrate of claim 1, wherein the width of the source electrode and the width of the drain electrode are less than the width of the semiconductor layer.

9. The array substrate of claim 1, wherein the semiconductor layer comprises an organic semiconductor layer.

10. A display panel, comprising:

an array substrate, comprising:

a substrate;

a source electrode and a drain electrode disposed on the substrate, wherein the drain electrode is disposed at one side of the source electrode;

a semiconductor layer disposed between the source electrode and the drain electrode, wherein the semiconductor layer overlaps with a portion of the source electrode and a portion of the drain electrode; and a channel defining layer, wherein the channel defining layer is correspondingly disposed on the source electrode and the drain electrode, and is disposed around the semiconductor layer;

wherein the semiconductor layer comprises a first segment, a second segment, a third segment, a fourth segment, and a fifth segment connected in sequence; the first segment is perpendicular to the second segment, the first segment is in contact with an upper surface of the portion of the source electrode overlapping with the semiconductor layer, and the second segment is in contact with a side surface of the portion of the source electrode overlapping with the semiconductor layer; the fourth segment is perpendicular to the fifth segment, the fourth segment is in contact with a side surface of the portion of the drain electrode overlapping with the semiconductor layer, and the fifth segment is in contact with an upper surface of the portion of the drain electrode overlapping with the semiconductor layer.

11. The display panel of claim 10, wherein the film thickness of the channel defining layer is greater than or equal to the film thickness of the semiconductor layer.

12. The display panel of claim 10, wherein the channel defining layer is provided with a printing opening, the semiconductor layer is correspondingly disposed in the printing opening and is in contact with the source electrode and the drain electrode which are corresponding to the printing opening, and the semiconductor layer is in contact with an inner sidewall of the channel defining layer.

13. The display panel of claim 12, wherein the source electrode and the drain electrode are correspondingly disposed at two sides of the printing opening, and a portion of the source electrode and a portion of the drain electrode extend into the printing opening.

14. The display panel of claim 13, wherein each of the source electrode and the drain electrode comprises an extension portion, the extension portion of the source electrode and the extension portion of the drain electrode both extend into the printing opening, and at least a portion of the semiconductor layer covers the extension portion of the source electrode and the extension portion of the drain electrode.

15. The display panel of claim 14, wherein the length of the extension portion of the source electrode is the same as the length of the extension portion of the drain electrode, and an overlapping area between the semiconductor layer and the extension portion of the source electrode is the same as an overlapping area between the semiconductor layer and the extension portion of the drain electrode.

16. The display panel of claim 14, wherein the length of the extension portion of the source electrode and the length of the extension portion of the drain electrode are greater than or equal to 2.5 millimeters.

17. The display panel of claim 10, wherein the width of the source electrode and the width of the drain electrode are less than the width of the semiconductor layer.

18. The display panel of claim 10, wherein the semiconductor layer comprises an organic semiconductor layer.

* * * * *